United States Patent [19]
Yonekawa et al.

[11] Patent Number: 5,410,571
[45] Date of Patent: Apr. 25, 1995

[54] PLL FREQUENCY SYNTHESIZER CIRCUIT

[75] Inventors: Masayuki Yonekawa; Takehiro Akiyama; Shinji Saito; Tetsuya Aisaka; Minoru Takagi, all of Kasugai, Japan

[73] Assignees: Fujitsu Limited, Kawasaki; Fujitsu VSLI Limited, Kasugai, both of Japan

[21] Appl. No.: 121,546

[22] Filed: Sep. 16, 1993

[30] Foreign Application Priority Data

Sep. 25, 1992 [JP] Japan ................... 4-257010

[51] Int. Cl.6 .............................. H03D 3/24
[52] U.S. Cl. .................. 375/376; 331/1 R; 331/DIG. 2; 455/260
[58] Field of Search ....... 375/118, 119, 120; 331/1 R, 18, 25, DIG. 2; 329/323, 325; 328/133, 155; 455/260, 265

[56] References Cited

U.S. PATENT DOCUMENTS

| | | | |
|---|---|---|---|
| 4,272,729 | 6/1981 | Riley, Jr. | 331/1 |
| 4,310,805 | 1/1982 | Hackert et al. | 331/25 |
| 4,787,097 | 11/1988 | Rizzo | 375/120 |
| 4,988,955 | 1/1991 | Horie | 331/11 |
| 5,260,979 | 11/1993 | Parker et al. | 375/120 |

FOREIGN PATENT DOCUMENTS

| | | |
|---|---|---|
| 0085615 | 8/1983 | European Pat. Off. |
| 0376847 | 7/1990 | European Pat. Off. |
| 0458269 | 11/1991 | European Pat. Off. |
| 0476605 | 3/1992 | European Pat. Off. |
| 2180708 | 4/1987 | United Kingdom |
| 2202700 | 9/1988 | United Kingdom |

Primary Examiner—Stephen Chin
Assistant Examiner—Hai H. Phan
Attorney, Agent, or Firm—Staas & Halsey

[57] ABSTRACT

A reference frequency divider divides a clock signal into a reference frequency signal, and outputs it. A comparison frequency divider circuit divides an output signal from a voltage controlled oscillator, and outputs it as a comparison signal. The reference signal and comparison signal are coupled to a phase comparator. The phase comparator detects the phase difference between the reference signal and comparison signal, and outputs a phase difference signal. A charge pump outputs a voltage signal in response to the phase difference signal from the phase comparator. A low pass filter smooths out the voltage signal from the charge pump to remove the high frequency components, and outputs a controlled voltage signal. A voltage controlled oscillator outputs an output signal with the frequency relating to the voltage value of the controlled voltage signal from the low pass filter. A frequency difference determining circuit compares the reference signal with the comparison signal. The circuit outputs a signal indicative of the frequency locked when the frequency difference is within the preset range, and outputs a signal indicative of the frequency unlocked when the difference of the frequency exceeds the preset range.

6 Claims, 12 Drawing Sheets

PLL FREQUENCY SYNTHESIZER CIRCUIT

FIELD OF THE INVENTION

The present invention relates generally to a phase locked loop frequency synthesizer circuit. More particularly, the present invention relates to a phase lock detecting circuit which determines whether the frequency of an output signal is locked, by computing the difference between a specific reference frequency and the frequency of the output signal.

DESCRIPTION OF THE RELATED ART

Recently, mobile communication devices such as portable telephones, and mobile telephones, etc. have been increasingly adopted as the preferred mode of mobile telephonic communication by the general public. To meet the demand for high quality clear communication, these systems require an advanced high speed signal tuning capacity. This requirement has been met to date with the general use of a phase locked loop frequency synthesizer circuit (hereinafter referred to as PLL circuit). Such PLL circuitry provides telecommunication signal detection accuracy by employing signal phase lock circuitry to minimize, as much as possible, phase locked-up time.

FIG. 1 shows a conventional PLL frequency synthesizer circuit such a one that would be found in a movable communication device. The PLL frequency synthesizer circuit includes a reference frequency divider 91, prescaler 92, comparison frequency divider 93, phase comparator 94, charge pump 95, low pass filter (hereinafter referred to as LPF) 96 and voltage controlled oscillator (hereinafter referred to as VCO) 97. The reference divider 91 divides a preset frequency of clock signal CLK from a crystal oscillator 98 and generates a reference signal LDR.

The generated reference signal LDR is output to the phase comparator 94. Preset frequency data DA and a channel switching signal LE from an external circuit are coupled to the comparison divider 93. The comparison divider 93 is formed with a program counter. The preset data DA are written or loaded to the comparison divider 93 according to the input channel signal LE. Further, the comparison divider 93 divides an output signal from the prescaler 92 according to the preset data DA, and outputs the divided data to the phase comparator 94 as a comparison signal LDP.

The phase comparator 94 compares the phase of reference signal LDR with that of comparison signal LDP. When the phase of reference signal LDR advances with respect to the phase of comparison signal LDP, the phase comparator 94 outputs a phase difference signal $\phi R$ corresponding to the phase difference, which is fed to charge pump 95.

Concurrently with the phase of comparison signal LDP advancing with respect to the phase of reference signal LDR, the phase comparator 94 outputs a phase comparison signal $\phi P$, which corresponds to the phase difference, to the input of charge pump 95. The charge pump 95 outputs an analog voltage signal as an output signal "Do", according to the phase difference signals $\phi R$ and $\phi P$, to the LPF 96.

The LPF 96 smooths out the output signal Do from the charge pump 95, and removes the high frequency components from the signal Do. LPF 96 then outputs the processed signal to the VCO 97 as a controlled voltage signal VT. The VCO 97 outputs an output signal "fv" having a frequency which is proportional to the voltage of the controlled voltage signal VT. This output signal "fv" is divided by the preset dividing ratio by the prescaler 92. The divided signal is finally fed back to comparison divider 93.

The PLL frequency synthesizer circuit operates in such a fashion that the output signal "fv" from the VCO 97 converges to a specific frequency set according to preset data DA. In other words, when a channel switching signal LE is coupled to the comparison divider 93 while the output signal "fv" has been converged to the preset frequency, new data DA is written or loaded into comparison divider 93. The dividing ratio is then altered according to the newly loaded data DA, such that a new comparison signal LDP is output from the comparison divider 93.

The phases of reference signal LDR and comparison signal LDP diverge in phase with phase difference signals $\phi R$ and $\phi P$ output from phase comparator 94 to the charge pump 95. The voltage of the controlled voltage signal VT is altered in accordance with the change in the voltage of output signal "Do" from charge pump 95. Thus, the output signal "fv" from the VCO 97 converges to a frequency based on the newly preset frequency data DA.

Given the above circuit description, a critical concern in processing signal "fv", is determining whether the signal "fv" has converged to a frequency based on preset data DA. To address this concern, the PLL frequency synthesizer circuit includes a lock detecting circuit, for example as the one shown in FIG. 2. The lock detecting circuit 80 includes digital data flip-flops (hereinafter referred to as FF) 81 through 83, AND gate 84 and invertor 85. The phase difference signals $\phi R$ and $\phi P$ from the phase comparator 94 illustrated in FIG. 1 are inverted to form a phase difference signal "a", as shown in FIG. 2.

The inverted phase difference signal "a" is coupled to a data input terminal of the FF 81. A clock signal "i" from the reference divider 91 is coupled to a clock input terminal of the FF 81. As shown in FIG. 3, the FF 81 maintains or holds current phase difference signal "a" in response to the rise of the clock signal "i", and outputs signal "a" as an output signal "b" to the AND gate 84. The output signal "b" is coupled to the AND gate 84, as is phase difference signal "a". When both the phase difference signal "a" and the output signal "b" rise to a logic high state, AND gate 84 outputs signal "c" in a FF 82 at the succeeding stage.

Output signal "c" from AND gate 84 is then coupled to the data input terminal of the FF 82, while clock signal "i" is coupled to a clock input terminal of the FF 82. As shown in FIG. 3, the FF 82 inverts output signal "c" according to the rise of the clock signal "i", holds "c", and transmits "c" as an output signal "d" to the FF 83 at the successive stage.

In other words, when the phase difference signal "a" is at a logically high level for a period of time longer than the time interval between the rise of two successive clock signals "i", FF 82 outputs a logic low level signal as output signal "d". When phase difference signal "a" is logically high and has a pulse width less than the time interval between the rises of two consecutive clock signals "i", FF 82 outputs a logic high level signal as the output signal "d".

Output signal "d" is then coupled to the data input terminal of FF 83, with inverted phase difference signal "a" coupled to a clock input terminal through invertor 85. As shown in FIG. 3, the FF 83 holds the output signal "d" according to the falling edge of the phase difference signal "a", and outputs "d" as output signal LD. In other words, when the phase difference signal "a" falls logically low during a time when the output signal "d" is itself at a logic low, FF 83 outputs a logic low level output signal LD.

Moreover, when the phase difference signal "a" remains high for a time period longer than the period of time between the rise of the two consecutive clock signals "i", FF 83 outputs signal LD logically low which, as shown in FIG. 3, indicates a state where the frequency of the output signal "fv" is unlocked.

When phase difference signal "a" falls to a logic low during a time when output signal "d" is high, FF 83 outputs signal LD logically high. In other words, when a high level pulse width of phase difference signal "a" is less than the period of time between the rise of two consecutive clock signals "i", FF 83 outputs a high logic level output signal LD. Signal LD, in turn, is indicative of a state where the frequency of output signal "fv" is locked.

On the other hand, when output signal LD is output at a logic low level from the lock detecting circuit 80, the PLL frequency synthesizer circuit determines that the output signal fv is in the unlocked condition. That is, when signal LD is output logically high, the PLL frequency synthesizer circuit determines that the output signal "fv" is in the locked condition.

Unfortunately, conventional lock detecting circuits 80, such as the above-described type, detect the locked or unlocked condition of frequency only during the period when phase difference signal "a" is generated at a high state. During the period of time when the phase difference signal "a" is high, the detection of a locked condition is carried out by the circuit according to the number of rises of the clock signals "i".

Therefore, to increase detection accuracy for detecting the locked or unlocked condition of output signal "fv" from the PLL frequency synthesizer circuit, the cycle of clock signals "i" should be shortened. However, a phase difference can exist between signals LDP, LDR despite the signal "fv" indicating that a locked condition exists even though a phase difference, in fact, does not exsist. When the cycle of the clock signals "i" is too short, the unlocked condition may be erroneously detected even though the frequency is locked. Therefore, improving the accuracy of the lock detention operation is difficult as long as such conventional circuits utilize phase difference signals $\phi R$ and $\phi P$.

SUMMARY OF THE PRESENT INVENTION

A primary object of the present invention is to provide a PLL frequency synthesizer circuit, which can detect a phase locked condition with high accuracy without utilizing phase difference signals output from a phase comparator.

To achieve the foregoing objects, a voltage controlled oscillator inputs a controlled voltage signal and outputs an output signal having a frequency which corresponds to a voltage of the controlled voltage signal in the PLL frequency synthesizer circuit, according to the present invention. A reference frequency divider divides a clock signal, and outputs the divided clock signal as a reference signal. A comparison frequency divider circuit divides the output signal from the voltage controlled oscillator, and outputs the divided output signal as a comparison signal. A phase comparator detects the phase difference of the reference signal from the phase comparator and the comparison signal, and outputs a phase difference signal.

A charge pump outputs a voltage signal according to the phase difference signal output from the phase comparator. A low pass filter smooths out the voltage signal output from the charge pump, and removes the high frequency components from the controlled voltage signal, then outputs the voltage signal to the voltage controlled oscillator. A frequency comparing and detecting circuit compares the difference in frequencies between the reference signal and the comparison signal, and outputs a lock detecting signal that indicates a frequency is locked only when the difference in the frequencies is within a predetermined value range.

BRIEF DESCRIPTION OF THE DRAWINGS

The features of the present invention that are believed to be novel are set forth with particularity in the claims. The invention, together with the objects and advantages thereof, may best be understood by reference to the following description of the presently preferred embodiment, together with the accompanying drawings, in which:

DESCRIPTION OF THE PREFERRED EMBODIMENTS

A preferred embodiment of phase locked loop synthesizer circuit (hereinafter referred to as PLL frequency synthesizer circuit) according to the present invention is described hereinbelow. A typical PLL is a frequency negative feed back circuit designed to maintain a frequency of an output signal at a preset frequency. A circuit 20 illustrated in FIG. 4 has such a PLL. The frequency of a clock signal CLK from a crystal oscillator 22 and the frequency of an output signal "fv" from a voltage controlled oscillator 26 are divided respectively, and then phases of both signals are compared with each other. A feed back signal "D0" is generated by a first charge pump in the PLL in response to the comparison. The frequency of output signal "fv" converges to the preset frequency in response to the signal "D0".

Figure 1:
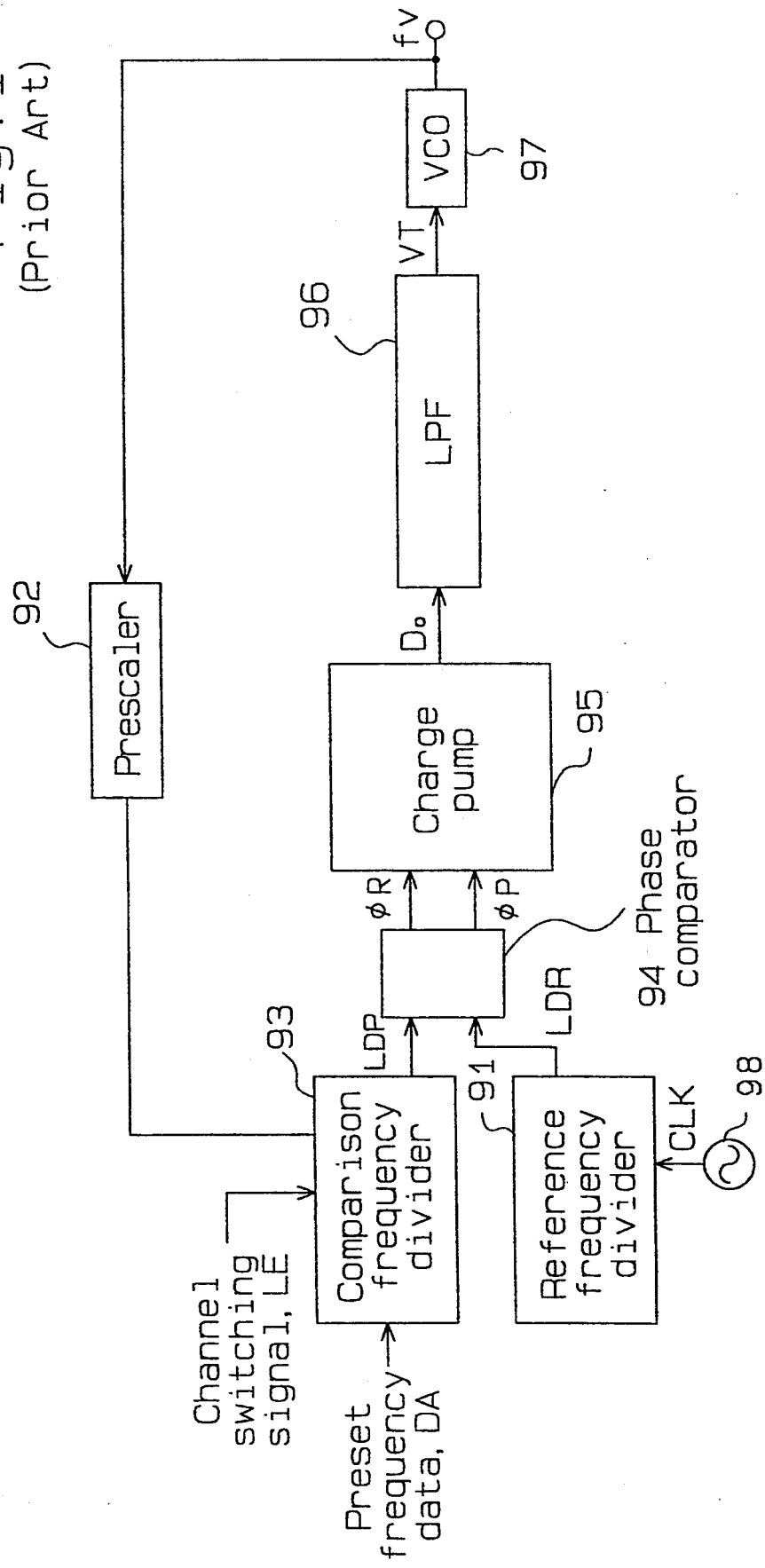
FIG. 1 is a block diagram showing a conventional PLL frequency synthesizer circuit.
Figure 2:
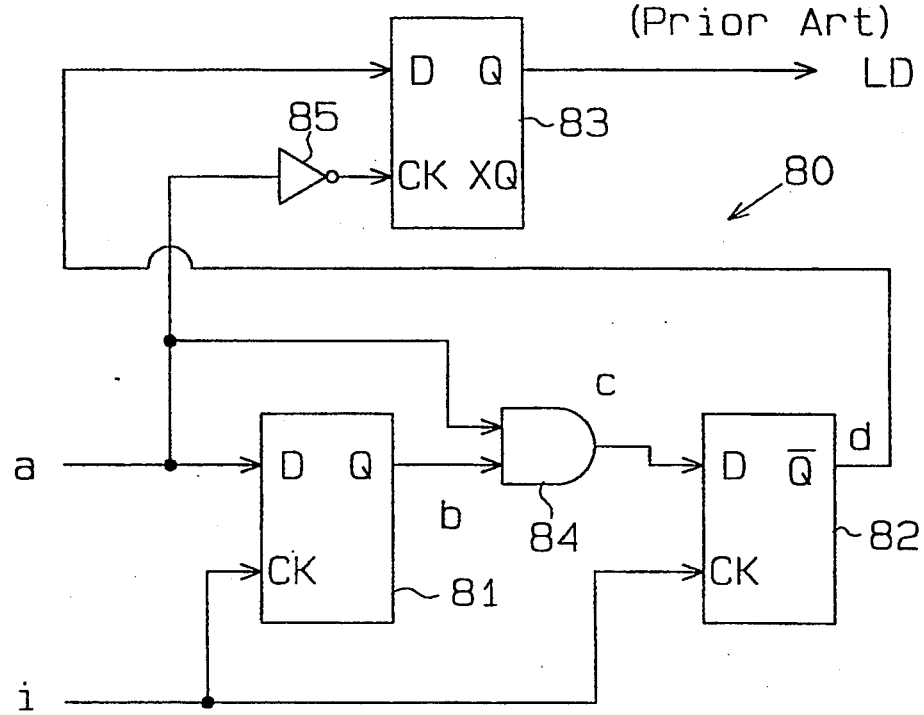
FIG. 2 is a block diagram showing a conventional phase locked condition detecting circuit.
Figure 3:
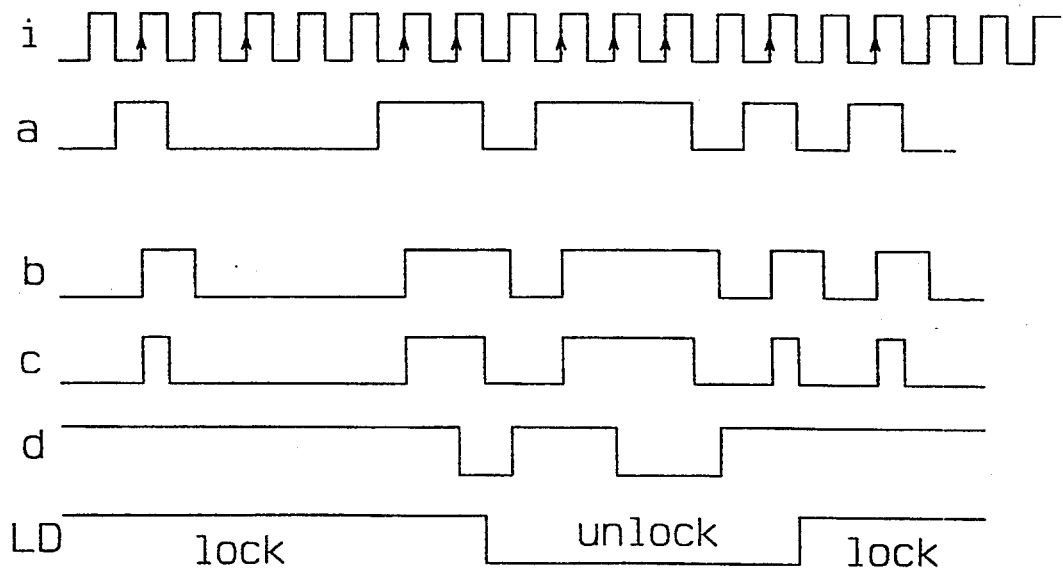
FIG. 3 is a waveform diagram showing the operations carried out by the conventional phase locked condition detecting circuit.
Figure 4:
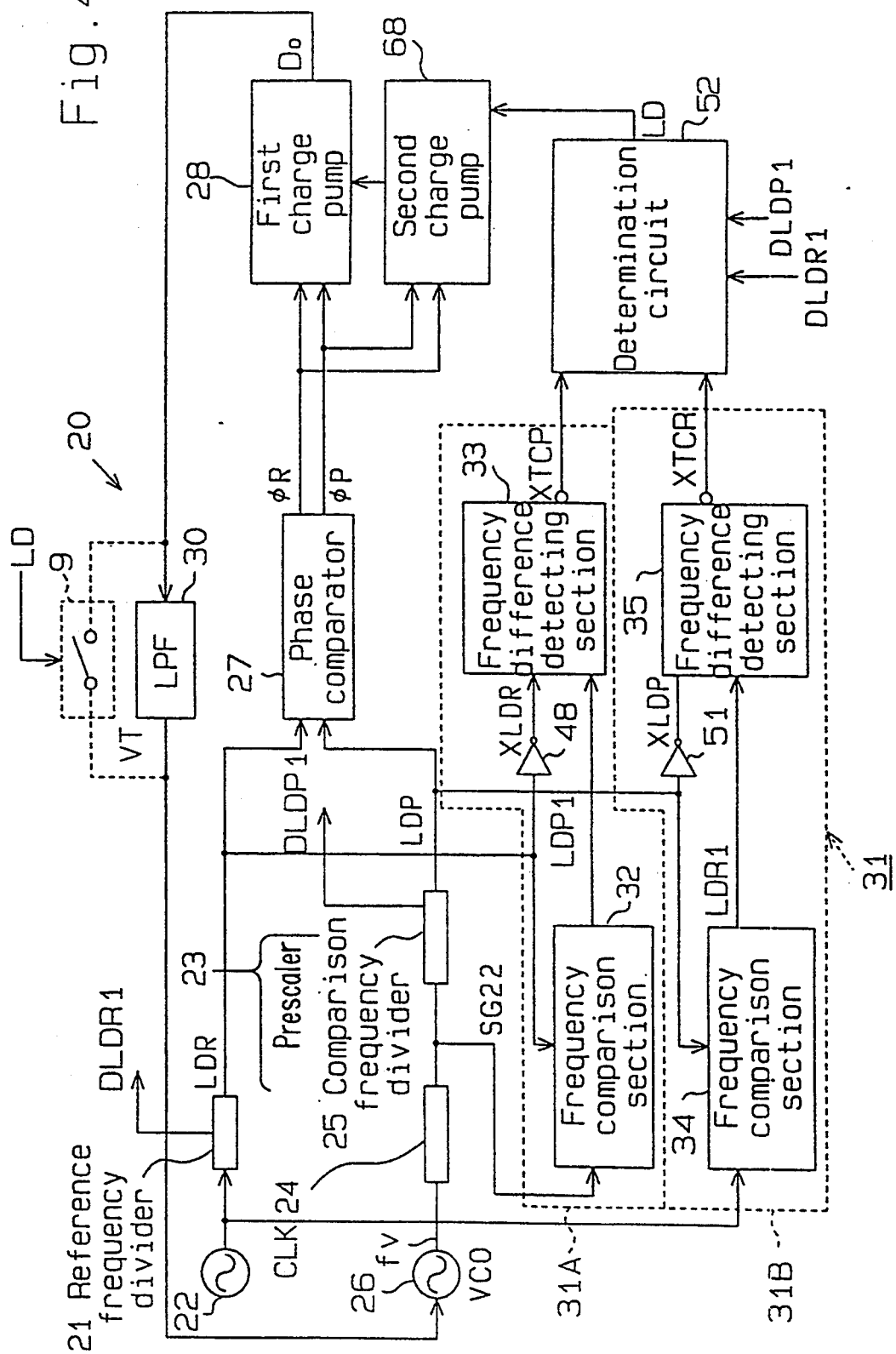
FIG. 4 is a block diagram of a PLL frequency synthesizer circuit of an embodiment according to the present invention.

The circuit 20 in the embodiment further includes a first frequency comparison circuit 31A that directly compares the frequency of a reference signal LDR generated from the clock signal CLK to that of output signal "fv". The circuit 20 also includes a second frequency comparison circuit 31B that directly compares the frequency of a signal LDP resulting from the output signal "fv" to the frequency of the clock signal. Based on the comparison by both circuits 31A, 31B, a determination circuit 52 causes a second charge pump 68 to operate in cooperation with the first charge pump 28 in the PLL, accelerating the convergence of frequency of output signal to the preset frequency. FIG. 4 shows a phase locked loop synthesizer circuit 20 (hereinafter referred to as PLL frequency synthesizer circuit) in this embodiment. A clock signal CLK having a preset frequency from a crystal oscillator 22 is coupled to a reference frequency divider 21. The reference divider 21 divides the clock signal CLK based on the preset dividing ratio, and outputs a respective reference signal LDR as shown in FIG. 16.

Figure 16:
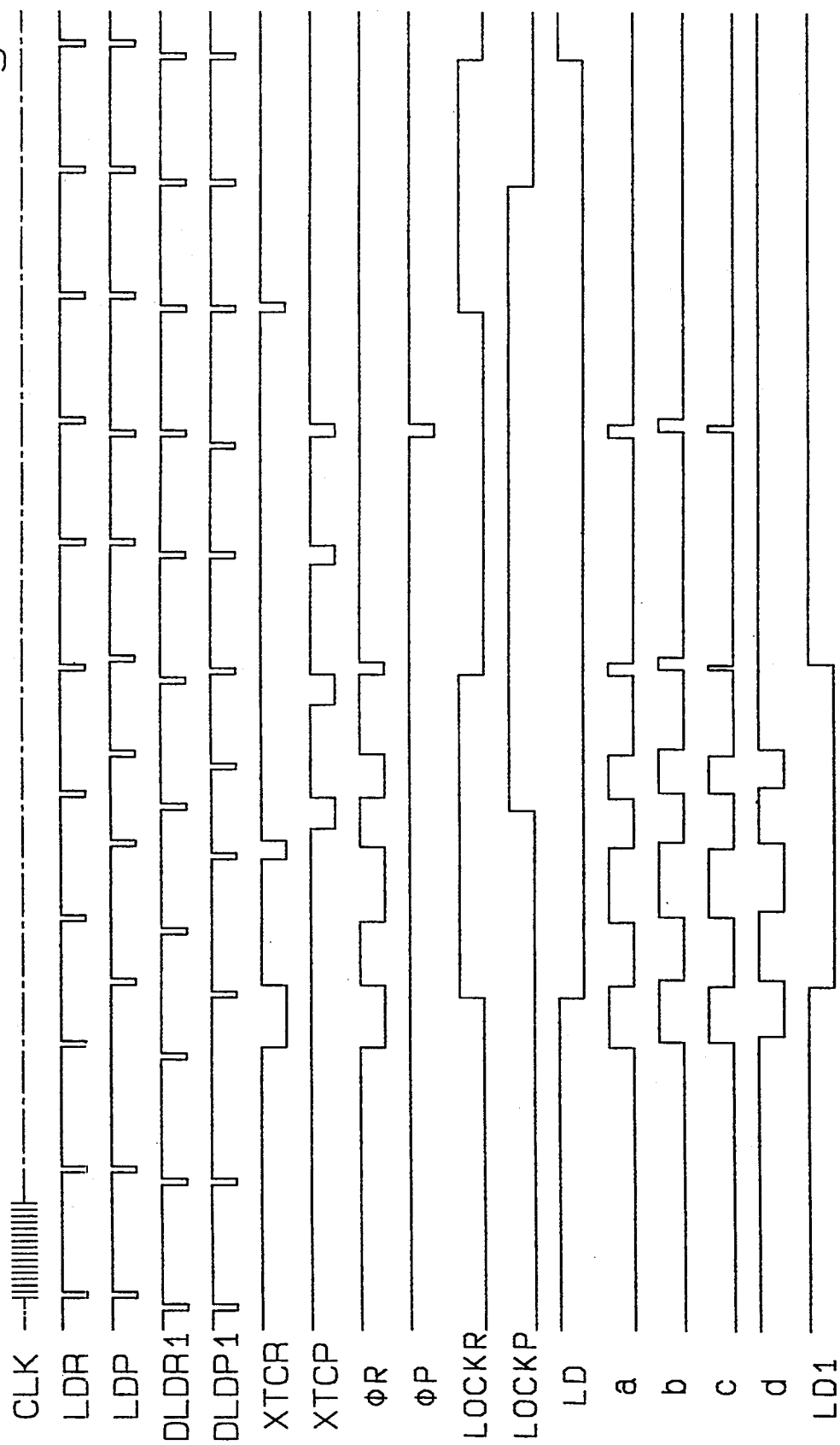
FIG. 16 is a waveform diagram showing the operations when the preset frequency is raised.

Further, the reference divider 21 includes a shift register which synchronously operates with the clock signal CLK, and which outputs a second reference signal DLDR1 as shown in FIG. 16. The second signal DLDR1 has the same frequency as that of the reference signal LDR, and is output one clock phase of the clock signal CLK before the reference signal LDR.

A comparison frequency divider circuit 23 is formed with a prescaler 24 and a comparison frequency divider 25. The prescaler 24 divides the frequency of an output signal "fv" from a voltage controlled oscillator (hereinafter referred to as VCO) 26 by a preset dividing ratio to generate a divided signal SG22, and then outputs SG22 to the comparison divider 25. The comparison divider 25 is formed with a program counter, and further divides divided signal SG22. This divided signal SG22 is output as reference signal LDP.

The comparison divider 25 generates and outputs a second comparison signal DLDP1 as shown in FIG. 16, in addition to the comparison signal LDP. The second comparison signal DLDP1 has the same frequency as the frequency of the comparison signal LDP, and is output one clock phase of the clock signal CLK before the reference signal LDP. The second comparison signal DLDP1 is generated by a shift register disposed in the comparison divider 25. The reference signal LDR and comparison signal LDP are coupled to a phase comparator 27.

Figure 17:
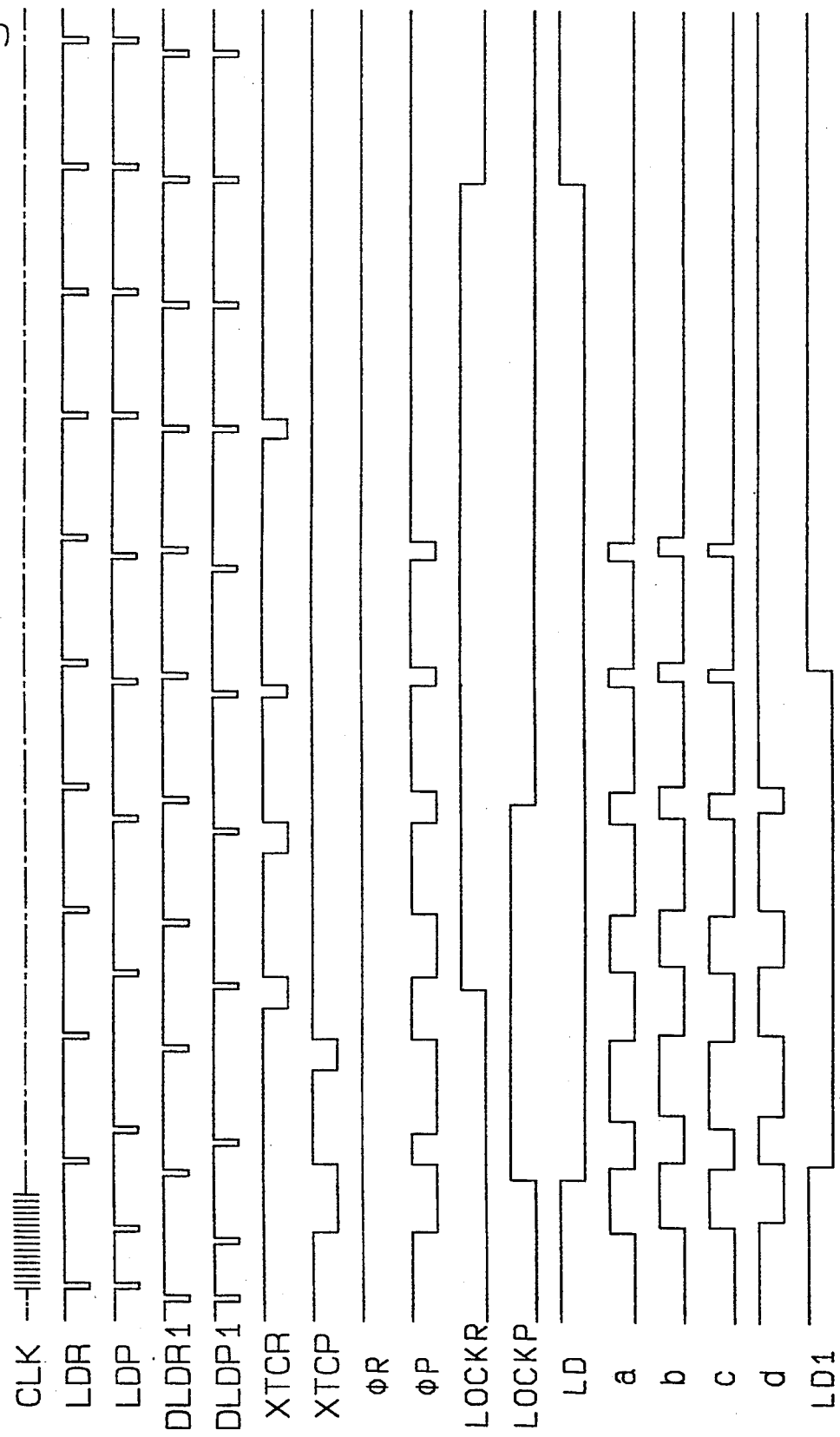
FIG. 17 is a waveform diagram showing the operations when the preset frequency is lowered.

The phase comparator 27 compares the phases of the signals LDR and LDP. When the phase of the reference signal LDR is advanced with respect to the phase of the comparison signal LDP, the phase comparator 27 outputs a low phase difference signal $\phi$R having a pulse width proportional to the phase difference as between signals LDR and LDP, as shown in FIG. 16. When the phase of the reference signal LDR is delayed with respect to that of the comparison signal LDP, the phase comparator 27 outputs a phase difference signal $\phi$P at a low level having a pulse width proportional to the phase difference between signal LDR and LDP as shown in FIG. 17.

Figure 15:
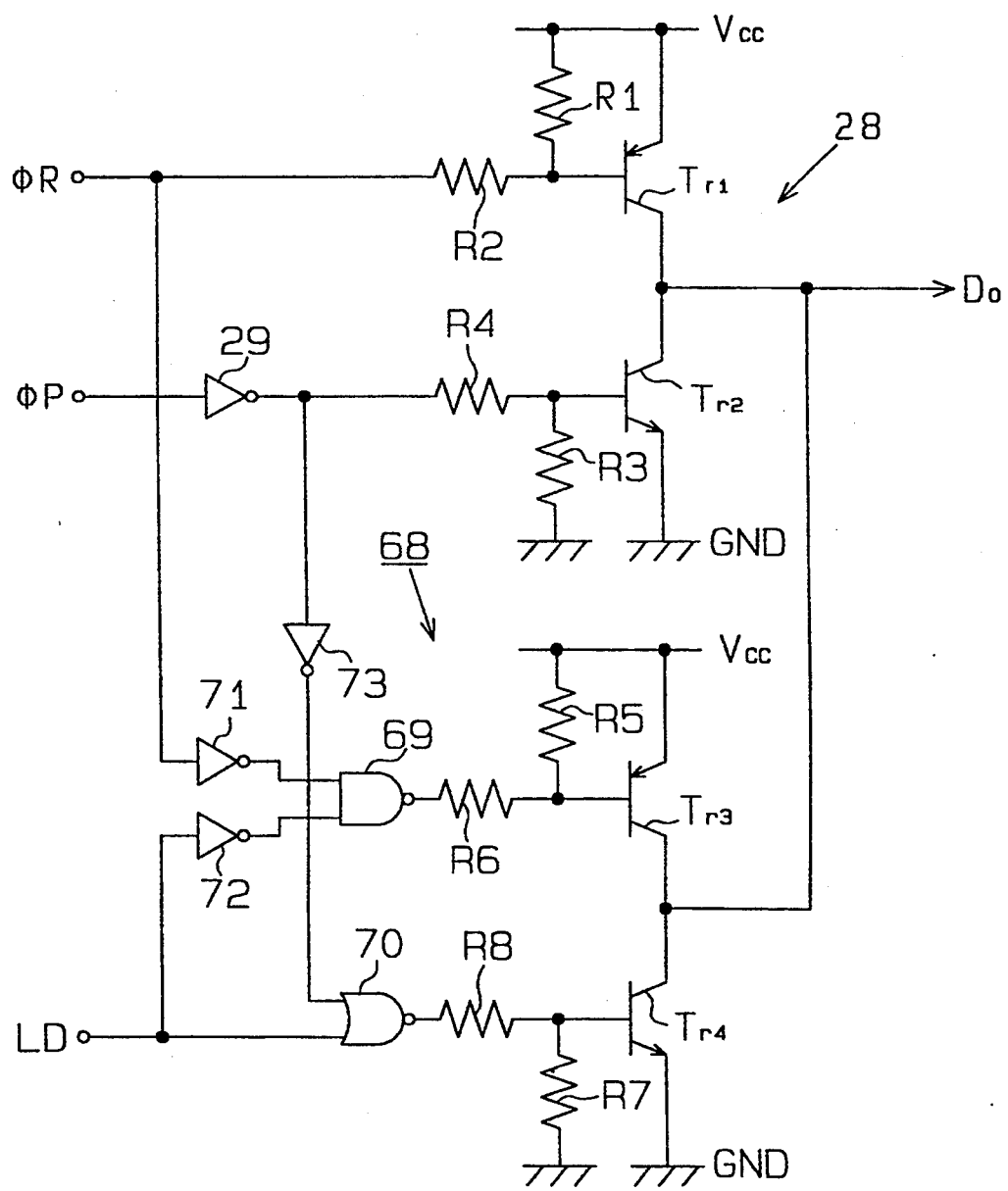
FIG. 15 is a circuit diagram of a charge pump.

The first charge pump in the PLL shown in FIG. 4 will now be described in detail, with reference to FIG. 15. The phase difference signals $\phi$R and $\phi$P are coupled to a first charge pump 28. As shown in FIG. 15, the charge pump 28 includes a PNP transistor Tr1, NPN transistor Tr2, resistors R1 through R4 and an invertor circuit 29. The collectors of the transistors Tr1 and Tr2 are mutually connected. The emitter of the transistor Tr1 is connected to a high voltage power source Vcc.

The emitter of the transistor Tr2 is connected to a low voltage power source, or alternatively, to GND. The phase difference signal $\phi$R is coupled to the base of the transistor Tr1 through the resistor R2. The base of the transistor Tr1 is connected to the power source Vcc through resistor R1. Therefore, when the phase difference signal $\phi$R, while at a high level, is coupled to the base of the transistor Tr1, transistor Tr1 becomes non-conductive.

The phase difference signal $\phi$P is coupled to the base of the transistor Tr2 through the invertor 29 and resistor R4. The base of the transistor Tr2 is connected to the low voltage power source GND through the resistor R3. When the phase difference signal $\phi$P having an H level is coupled to the base of the transistor Tr2, the transistor Tr2 becomes nonconductive.

As described above, when the phase of the reference signal LDR shown in FIG. 16 precedes the frequency of the comparison signal LDP, the phase difference signal $\phi$R, while at a low level and having a pulse width which is proportional to the phase difference between LDR and LDP, is intermittently output from the phase comparator 27. At the same time, the phase difference signal $\phi$P is at a high level. The transistor Tr2 becomes non-conductive given a high level of the phase difference signal $\phi$P, with the result being that transistor Tr1 is intermittently activated in response to changes in phase difference signal $\phi$R.

As a result, the voltage level of output signals "Do" from the collectors of the transistors Tr1 and Tr2 increases. As shown in FIG. 17, when the phase of the reference signal LDR is delayed with respect to that of the comparison signal LDP, the phase comparator 27 intermittently outputs a low level phase difference signal $\phi$P having a pulse width which is proportional to the phase difference between signal LDR and LDP. At the same time, the phase difference signal $\phi$R is at a high level. The transistor Tr1 becomes non-conductive according to the phase difference signal $\phi$R, and the transistor Tr2 is intermittently activated according to the phase difference signal $\phi$R. As a result, the voltage level of output signals Do from the collectors of the transistors Tr1, Tr2 is lowered.

The output signal "Do" from the first charge pump 28 is coupled to a low pass filter (hereinafter referred to as LPF) 30. The LPF 30 removes the high frequency components from the output signal Do, effectively smoothing the signal's waveform, and outputs the processed signal as a controlled voltage signal VT to the VCO 26. The VCO 26 outputs an output signal "fv" with a frequency corresponding to the voltage of the controlled voltage signal VT. The output signal "fv" is then fed back to the comparison divider 25 through the prescaler 24. The first and second frequency comparators will now be described in detail with reference to FIGS. 4 to 8.

As illustrated in FIG. 4, divided signal SG22 from the prescaler 24, comparison signal LDP from the comparison divider 25, reference signal LDR from the reference divider 21 and clock signal CLK from the crystal oscillator 22 are coupled to a frequency comparison circuit 31. The comparison circuit 31 is formed with a first and a second frequency comparators 31A, 31B. The first comparator 31A is formed with a frequency comparison section 32 and a frequency difference detecting section 33. The second comparator 31B is formed with a frequency comparison section 34 and a frequency difference detecting section 35.

Figure 5:
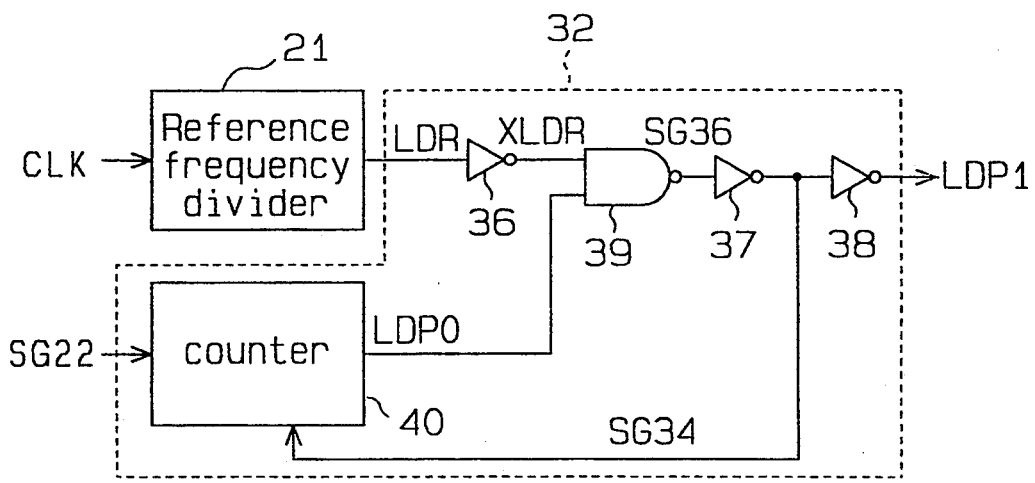
FIG. 5 is a circuit diagram showing a frequency comparison section of a first frequency comparator.

As shown in FIG. 5, the comparison section 32 of the first comparator 31A includes invertor circuits 36 through 38, NAND gate 39 and a counter 40. The reference signal LDR is inverted by the invertor circuit 36 to generate a reference signal XLDR, which is coupled to a first input terminal of the NAND gate 39. An output signal LDP0 from the counter 40 is coupled to a second input terminal of the NAND gate 39. The NAND gate 39 outputs a logic product of the reference signal XLDR and output signal LDP0 as an output signal SG36.

Figure 7:
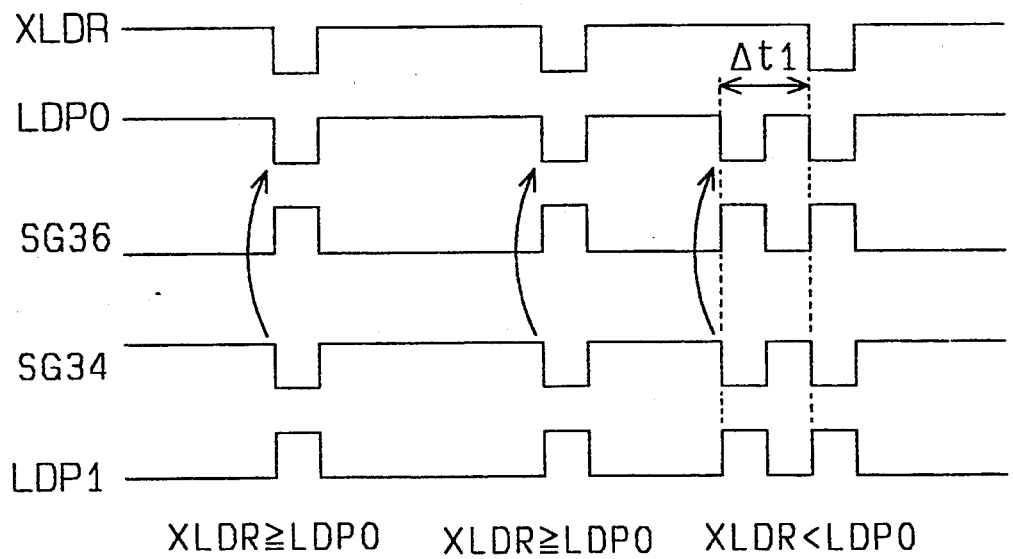
FIG. 7 is a waveform diagram showing the operations carried out by the frequency comparison section of the first frequency comparator.

The output signal SG36 is output as a frequency comparison signal LDP1 through invertors 37 and 38. Therefore, as shown in FIG. 7, when the reference signal XLDR and output signal LDP0 are both at a logic high level, the frequency comparison signal LDP1 is at a logic low level. Further, when at least one reference signal, XLDR or output signal LDP0, is at a logic low level, the frequency comparison signal LDP1 changes to logic high.

As shown in FIG. 5, counter 40 further divides the divided signal SG22 from prescaler circuit 24. The dividing ratio of counter 40 is set equal to the dividing ratio of the comparison frequency divider 25. The output signal SG34 from the invertor 37 is coupled to the counter 40. Then, the counter 40 divides the pulse of the divided signal SG22, and outputs a logic low level pulse signal as the output signal LDP0. The counter 40 not only resets every time the reference signal XLDR switches to a logic low level, but counter 40 also outputs a logic low level pulse signal as the output signal LDP0.

Therefore, as shown in FIG. 7, during the time when output signal LDP0 is at a logic low level, signal LDP0 is synchronously output with the pulse of the reference signal XLDR. The operation of resetting counter 40 is executed by the output signal SG34 from the invertor 37 according to the respective pulse of the reference signal XLDR. The condition that the frequency of the output signal LDP0 is equal to or lower than that of the reference signal XLDR, occurs when the frequency of the comparison signal LDP is equal to or lower than the frequency of reference signal LDR, and results in the frequency of the comparison signal being detected. Further, only a logic high level pulse synchronized with the pulse of the reference signal XLDR is output as comparison signal LDP1.

During output of signal LDP0, which is not synchronized with reference signal XLDR, the counted value of the counter 40 is reset by inputting a logic low level output signal SG34 from the invertor 37 in accordance with a logic low output of signal LDP0. Accordingly, the condition wherein the frequency of the output signal LDP0 is higher than the frequency of the reference signal XLDR, is detected. During the period of time $\Delta t1$ between the fall of output signal LDP0, which is not synchronized with the pulse of the reference signal XLDR, and the successive fall of the reference signal LDP0 which is synchronized with the reference signal XLDR, information becomes available which in effect determines the frequency difference between the signals LDP and LDR. The longer the period of $\Delta t1$, the higher the frequency ratio of the comparison signal LDP to that of the reference signal LDR.

Figure 6:
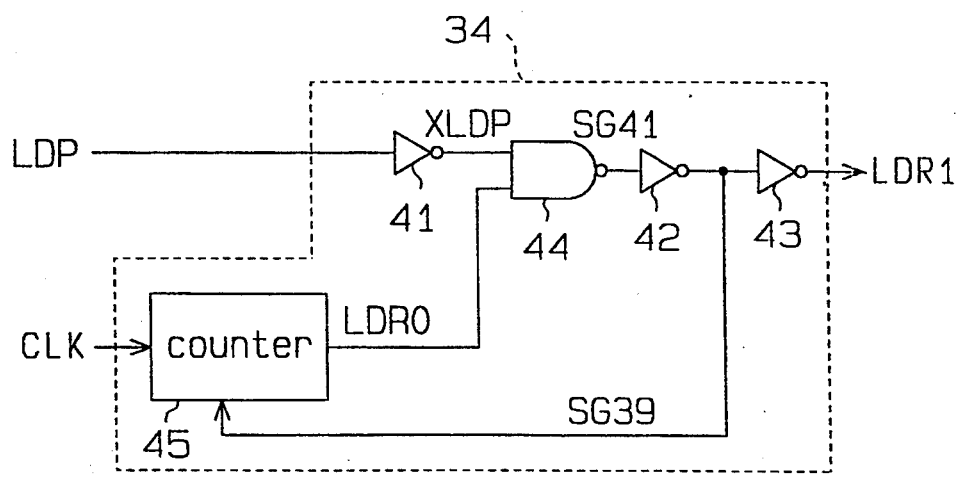
FIG. 6 is a circuit diagram showing a frequency comparison section of a second frequency comparator.

The frequency comparison section 34 of the second frequency comparator 31B as shown in FIG. 4 includes invertor circuits 41 through 43, a NAND gate 44 and a counter 45 as shown in FIG. 6. The comparison signal LDP is inverted by the invertor 41 to generate a comparison signal XLDP, which is coupled to a first input terminal of the NAND gate 44. An output signal LDR0 of the counter 45 is coupled to a second input terminal of the NAND gate 44. The NAND gate 44 outputs signal SG41 as a logic product of comparison signal XLDP and signal LDR0.

Figure 8:
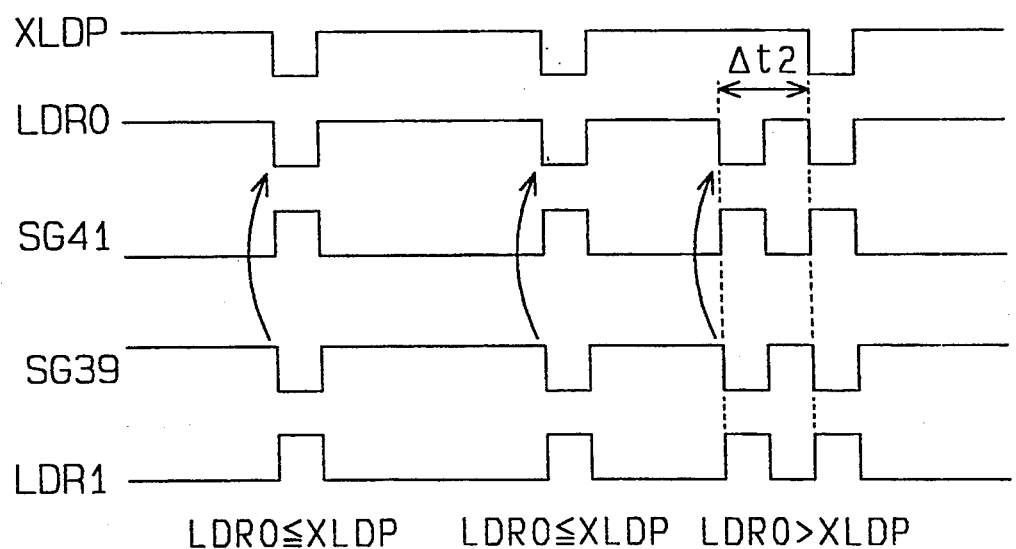
FIG. 8 is a waveform diagram showing the operations carried out by the frequency comparison section of the second frequency comparator.

The output signal SG41 is output as a frequency comparison signal LDR1 through the invertors 42, 43. Therefore, as shown in FIG. 8, when the comparison signal XLDP and output signal LDR0 are at a logic high level, the comparison signal LDR1 is at a logic low level. When at least one of the comparison signal XLDP and output signal LDR0 is at a logic low level, the frequency comparison signal LDR1 is at a logic high level.

FIG. 6 further illustrates that counter 45 divides the clock signal CLK from the crystal oscillator 22. The dividing ratio of counter 45 is set equal to the dividing ratio of the reference frequency divider 21. An output signal SG39 from the invertor 42 is coupled to the counter 45. The counter 45 divides the pulse of the clock signal CLK, and outputs a logic low level pulse signal as output signal LDR0.

The counter 45 is reset every time when both the output signal SG39, from the invertor 42, and the comparison signal XLDP are at a logic low level. Upon being reset, counter 45 outputs a logic low level pulse as output signal LDR0. Therefore, as shown in FIG. 8, when the logic low level pulse of the output signal LDR0 is synchronously output with the pulse of the comparison signal XLDP, counter 45 is reset upon the input of the output signal SG39, itself being at a logic low level due to the pulse of the signal XLDP. The circuit detects when the frequency of the comparison signal XLDP is equal to or higher than the frequency of the output signal LDR0 from the counter 45 in this case.

In other words, the circuit as illustrated in the present embodiment detects when the frequency of the comparison signal LDP is higher than that of the reference signal LDR. Only a logic level high pulse synchronized with a pulse of the comparison signal XLDP is output from the frequency comparison section 34 as a frequency comparison signal LDR1.

As shown in FIG. 8, when the pulse of the output signal LDR0 becomes asynchronous with comparison signal XLDP, counter 45 is reset by inputting a logic low level output signal SG39 from the invertor 42, to counter 45. Accordingly, the circuit detects when the frequency of the comparison signal XLDP is lower than the frequency of the output signal LDR0.

In other words, the circuit detects the condition when the frequency of the comparison signal LDP is lower than the frequency of the reference signal LDR. The specific period of time Δt2 between (1), the fall of the output signal LDR0, when LDR0 is asynchronous with the comparison signal XLDP, and (2), the fall of signal LDR0 when LDR0 is synchronous with signal XLDP, effectively by itself constitutes information relating to the frequency difference between the signals LDP and LDR. Therefore, the longer the period of time Δt2, the lower the frequency of the comparison signal LDP than the frequency of the reference signal LDR.

Figure 9:
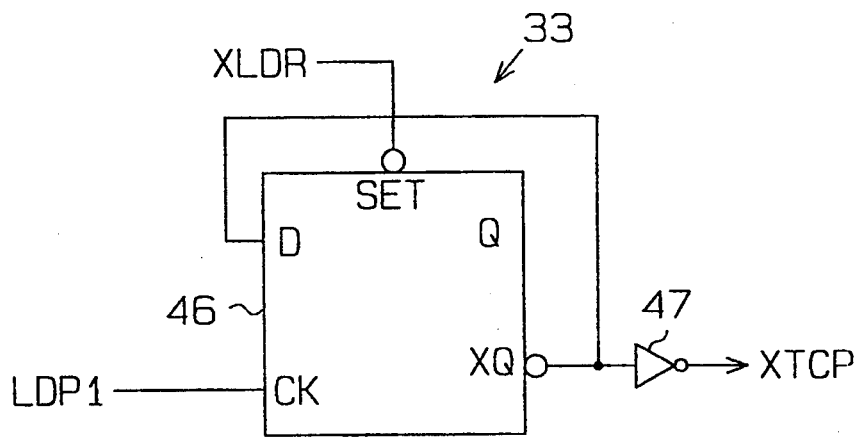
FIG. 9 is a circuit diagram of a frequency difference detecting section of the first frequency comparator.

The frequency difference detecting section 33 of first frequency comparator 31A will be described referring to FIG. 9. As shown in FIG. 9, the frequency difference detecting section 33 of the first frequency comparator 31A is formed with a data flip-flop (hereinafter referred to as data FF) 46 and invertor 47, which is connected to an inverted output terminal XQ of the data FF 46. An output signal from the inverted output terminal XQ is coupled to a data terminal D of the data FF 46.

The frequency comparison signal LDP1 of the frequency comparison section 32 is coupled to a clock terminal CK. A reference signal LDR is inverted by the invertor circuit 48 as shown in FIG. 4 to generate a reference signal XLDR, which is input to a set terminal "SET" of the data FF 46. When a logic low level reference signal XLDR is input to the data FF 46, an output signal from the inverted output terminal XQ is set to a logic low level.

Figure 11:
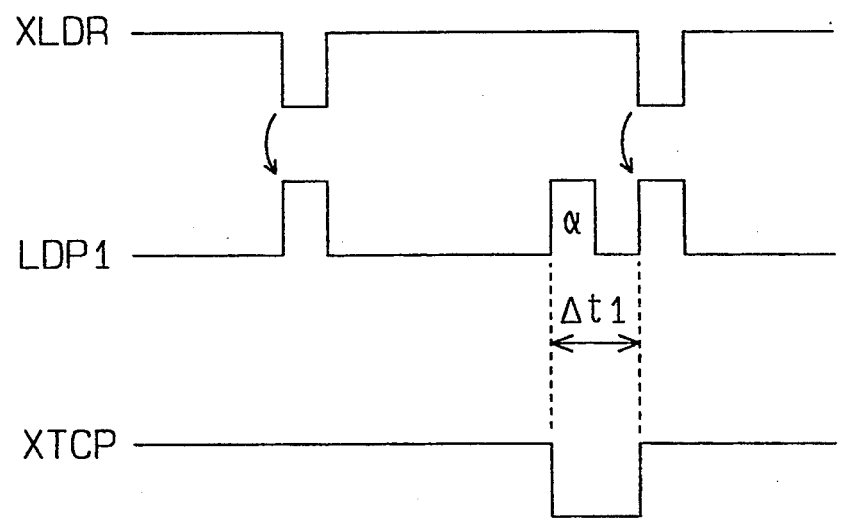
FIG. 11 is a waveform diagram showing the operations carried out by the frequency difference detecting section of the first frequency comparator.

As illustrated by FIG. 11, when a logic high level reference signal XLDR is coupled to the data FF 46, the data FF 46 latches the output signal from the inverted output terminal XQ every time a pulse of the comparison signal LDP1 is input thereto. The data FF 46 outputs the output signal from the inverted output terminal XQ as a second frequency difference signal XTCP through the invertor 47. Therefore, when the reference signal XLDR is at a logic low level, the output signal from the inverted output signal terminal XQ itself is also at a logic low level. This second frequency difference signal XTCP is graphically illustrated in FIG. 11.

When a pulse α which is not synchronized with the pulse of the reference signal XLDR is input during a time when reference signal XLDR is at a logic high level, the logic low level output signal from the inverted output terminal XQ is latched by the data FF 46. As a result, the second frequency difference signal XTCP falls to a logic low level during the period of time Δt1, that is, from the rise of the pulse α to the fall of the consecutive reference signal XLDR. This logic low level of the second frequency difference signal XTCP indicates that the frequency of the comparison signal LDP is higher than that of the reference signal LDR.

Figure 10:
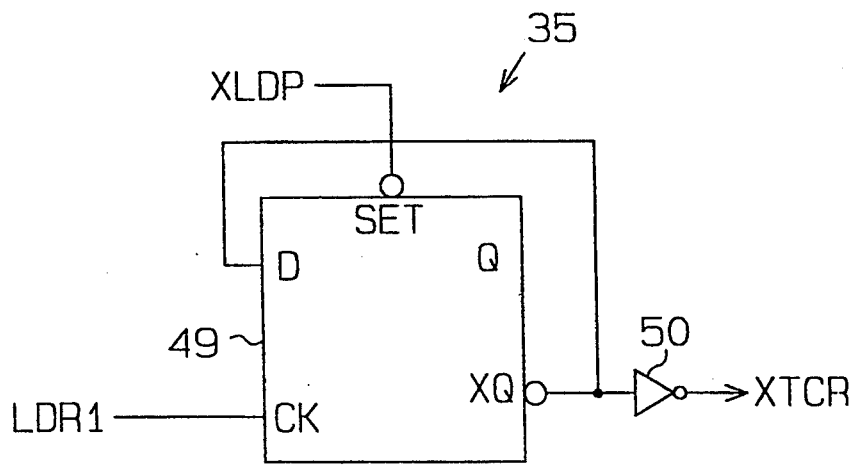
FIG. 10 is a circuit diagram of a frequency difference detecting section of the second frequency comparator.

The frequency difference detecting section 35 of second frequency comparator circuit 31B will be described referring to FIG. 10. As shown in FIG. 10, the frequency difference detecting section 35 of the second frequency comparator 31B is formed with a data FF 49 and an invertor circuit 50 connected to the inverted output terminal XQ. The output from the inverted output terminal XQ is coupled to a data terminal D of the data FF 49. A frequency comparison signal LDR1 from the frequency comparison section 34 is coupled to a clock terminal CK of the data FF 49.

A reference signal XLDP is coupled to the set terminal "SET" of the data FF 49. The comparison signal LDP from the comparison frequency divider 25 is inverted by an invertor circuit 51 to generate the reference signal XLDP, as shown in FIG. 4. When the L level comparison signal XLDP is coupled to the data FF 49, the output signal from the inverted output terminal XQ is set to a logic low level.

The data FF 49 latches the output signal from the inverted output terminal XQ at those times when a pulse of the frequency comparison signal LDR1 is input to FF 49 along with a logic high level comparison signal. The output signal from the inverted output terminal XQ is output as the first frequency difference signal XTCR through the invertor 50.

Figure 12:
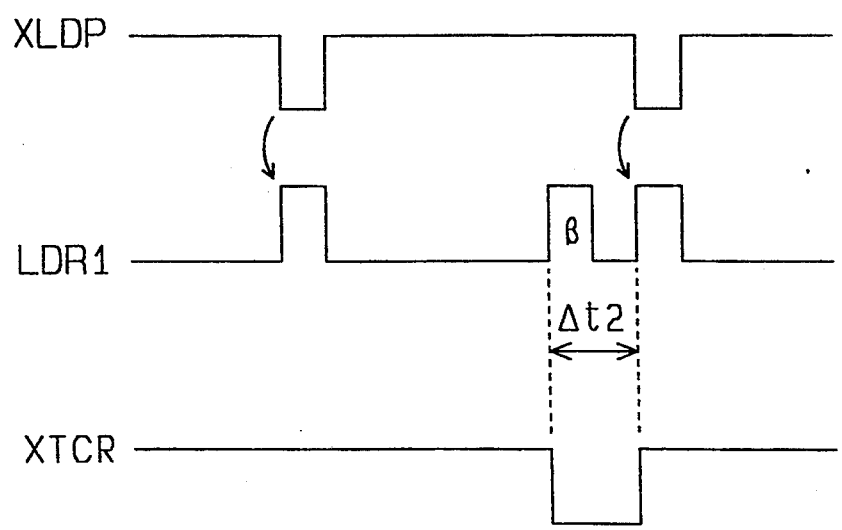
FIG. 12 is a waveform diagram showing the operation carried out by the frequency difference detecting section of the second frequency comparator.

Accordingly, as shown in FIG. 12, when the comparison signal XLDP is at a logic low level, the output signal from the inverted output terminal XQ of the data FF 49 falls to a logic low level, and the first frequency different signal XTCR rises to a logic high level. Further, when a pulse β of the frequency comparison signal LDR1 asynchronous to signal XLDP is input to the data FF 49 at a time when comparison signal XLDP is a logic high level, data FF 49 latches the logic low level output signal from the inverted output terminal XQ.

As a result, the output signal from the terminal XQ rises to a logic high level. Therefore, the first frequency difference signal XTCR is maintained at logic low level during the period of time Δt2 from the rise of the pulse β to the fall of the successive comparison signal XLDP. This L level first frequency difference signal XTCR indicates that the frequency of the comparison signal LDP is lower than the frequency of the reference signal LDR.

Figure 13:
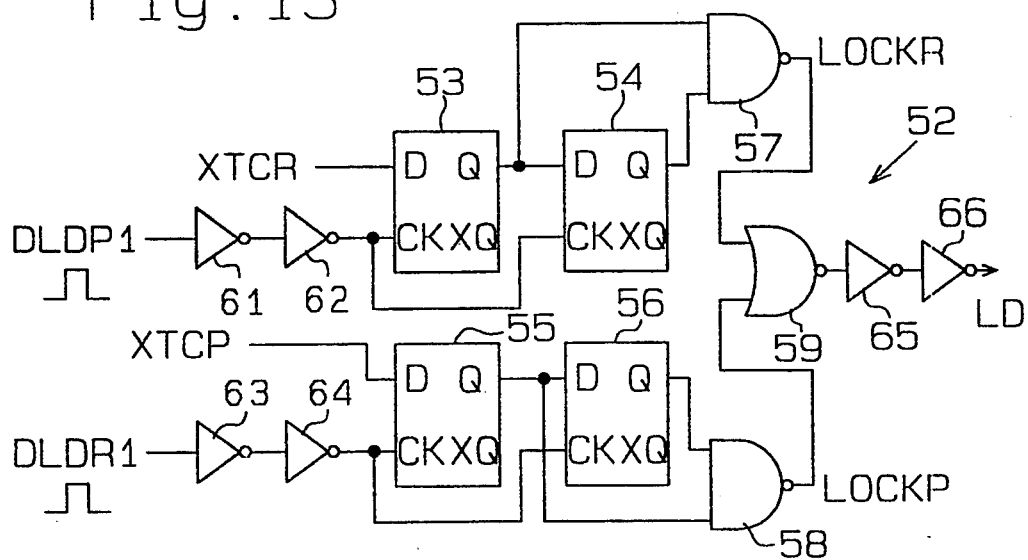
FIG. 13 is a circuit diagram of a determination circuit.

As shown in FIG. 4, the output signals XTCP and XTCR from the frequency difference detecting sections 33, 35 are coupled to a determination circuit 52, respectively. As shown in FIG. 13, the determination circuit 52 is formed with data FFs 53 through 56, NAND gates 57, 58, NOR gate 59 and invertor circuits 61 through 66. A first frequency difference signal XTCR is coupled to a data terminal D of the data FF 53.

A second comparison signal DLDP1 from the comparison frequency divider 25 is coupled to a clock terminal CK of the data FF 53 through the invertors 61, 62. The data FF 53 latches the first frequency difference signal XTCR and outputs XTCR from the output terminal Q of FF 53, every time a pulse of the second comparison signal DLDP1 is input thereto. As a result, when the pulse of the second comparison signal DLDP1 is input to the data FF 53 at a time when the first frequency difference signal XTCR is at a logic low level, data FF 53 outputs a logic low level output signal from the output terminal Q.

A data terminal D of a data FF 54 is connected to the output terminal Q of the data FF 53 arranged at the previous stage. A second comparison signal DLDP1 is coupled to a clock terminal CK of the data FF 54 through invertor circuits 61, 62. In this way, data FF 54 latches a signal transferred to data terminal D and outputs the signal from output terminal Q thereof every time the pulse of the second comparison signal DLDP1 is input.

As a result, when the successive pulse of the second comparison signal DLDP1 is transmitted to the data FF 54, the data FF 54 will latch the logic low level first frequency difference signal XTCR previously latched by the FF 53 at the previous stage. The output signals from the data FFs 53, 54 are coupled to the NAND gate 57, respectively, and an output signal LOCKR from the NAND gate 57 is coupled to the NOR gate 59.

A second frequency difference signal XTCP is coupled to a data terminal D of the data FF 55. A second reference signal DLDR1 from the reference frequency divider 21 is coupled to a clock terminal CK of the data FF 55 through invertors 63, 64. Therefore, data FF 55 latches the second frequency signal XTCP and outputs XTCP from the output terminal Q every time the pulse of the second reference signal DLDR1 is transmitted.

When the pulse of the second reference signal DLDR1 is input to FF 55 at a time when the second frequency difference signal XTCP is at a logic low level, data FF 55 outputs a logic low level output signal from the output terminal Q.

A data terminal D of the data FF 56 is connected to the output terminal Q of the data FF 55 arranged at the previous stage. A second reference signal DLDR1 is coupled to a clock terminal CK of the data FF 56 through the invertor circuits 63 and 64. Therefore, the data FF 56 latches the signal transmitted to the data terminal D and outputs the signal from an output terminal Q thereof every time the pulse of the second reference signal DLDR1 is transmitted.

As a result, when the successive pulse of the second reference signal DLDR1 is transmitted to the data FF 56, the data FF 56 will latch at a logic low level second frequency difference signal XTCP which was previously latched by the data FF 55 arranged at the earlier stage. The output signals from the data FFs 55, 56 are coupled to a NAND gate 58, respectively. An output signal LOCKP from NAND gate 58 is coupled to the NOR gate 59. An output signal from the NOR gate 59 is output as a lock detecting signal LD through the invertors 65 and 66.

Figure 14:
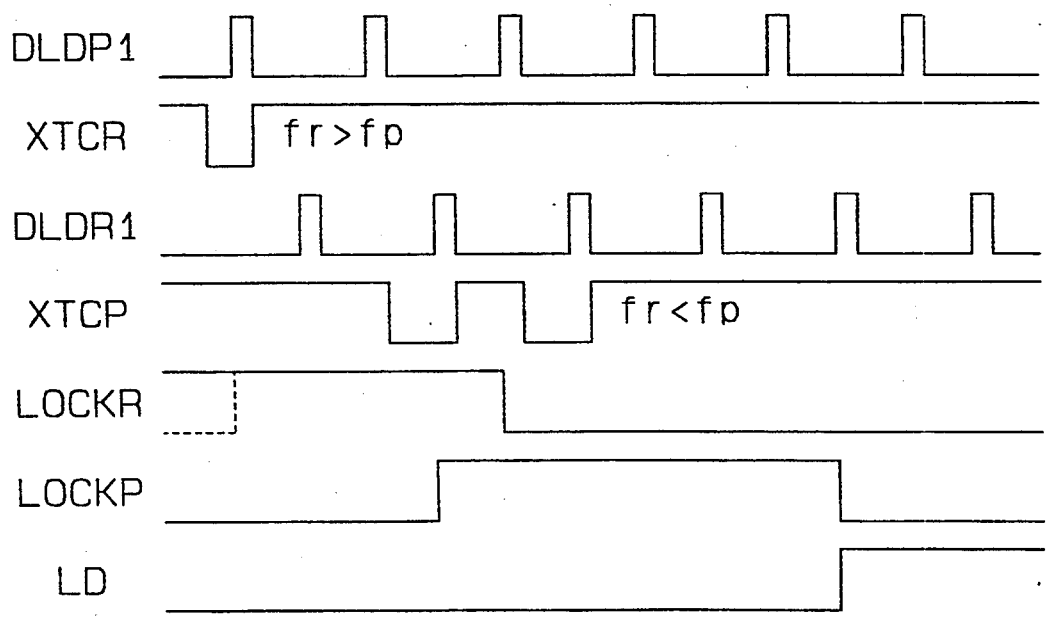
FIG. 14 is a waveform diagram showing the operations carried out by the determination circuit.

Therefore, as shown in FIG. 14, when at least one of the output signals LOCKR and LOCKP from the NAND gates 57 and 58 is at a logic high level, a logic low level lock detecting signal LD is output. When both the output signals LOCHR, LOCKP are at the logic low level, a logic high level lock detecting signal LD is output. In other words, when at least one of the first frequency difference signal XTCR and the second frequency difference signal XTCP falls to a logic low level, the lock detecting signal LD also falls to a logic low level.

When both the first signal XTCR and second signal XTCP rise to a logic high level, the lock detecting signal LD similarly rises to a logic high level. That is, when the difference in frequencies between the comparison signal LDP and reference signal LDR are generated, the lock detecting signal LD falls to a logic low level. When no difference in frequencies therebetween is generated, the lock detecting signal LD rises to a logic high level.

Therefore, when the lock detecting signal LD is changed from a logic high to a low level, that indicates the phase of the frequency is changed from locked to un-locked. On the other hand, when the lock detecting signal LD changes from a logic low to a high level, that indicates the phase will be changed from un-locked to locked. The second charge pump 68 will be described with reference to FIGS. 4 and 15.

As shown in FIG. 4, the lock detecting signal LD from the determination circuit 52 is transmitted to a second charge pump 68. As shown in FIG. 15, the second charge pump 68 includes a PNP transistor Tr3, an NPN transistor Tr4, resistors R5 through R8, a NAND gate 69, a NOR gate 70 and invertor circuits 71 through 73. The collectors of the transistors Tr3, Tr4 are mutually connected. The collectors of the transistors Tr3, Tr4 in charge pump 28 are connected to the collectors of the PNP and NPN transistors Tr1 and Tr2 respectively.

An emitter of the transistor Tr3 is connected to the high voltage power source Vcc. An emitter of the transistor Tr4 is connected to the low voltage power source or GND. A base of the transistor Tr3 is connected to an output terminal of the NAND gate 69 through the resister R6. The phase difference signal $\phi$R is coupled to the NAND gate 69 through the invertor 71, while lock detecting signal LD is coupled thereto through the invertor 72. A base of the transistor Tr3 is connected to the high voltage power source Vcc through the resistor R5.

Therefore, when a logic high level signal is output from the NAND gate 69, transistor Tr3 becomes non-conductive. The base of the transistor Tr4 is connected to an output terminal of the NOR gate 70 through the resistor R8. The phase difference signal $\phi$P is coupled to the NOR gate 70 through the invertors 29 and 73. Lock detecting signal LD is likewise coupled to NOR gate 70. A base of the transistor Tr4 is connected to the low voltage power source or GND through the resistor R7. When a logic low level output signal is output from the NOR gate 70, the transistor Tr4 becomes nonconductive.

A second charge pump, having essentially the same configuration, as the charge pump illustrated in FIG. 15, operates in such a way that when the lock detecting signal LD is at a logic high, a logic low signal is then transmitted to the NAND gate 69, by invertor circuit 72. While logic high lock detecting signal LD is transmitted at a logic high level to NOR gate 70. Then, an logic high level signal is output from the NAND gate 69, irrespective of the level of the phase difference signal $\phi$R. A consequence of this is that transistor Tr3 becomes non-conductive.

A logic low level signal is output from the NOR gate 70 regardless of the level of the phase difference signal $\phi$P, such that the transistor Tr4 becomes non-conductive. Therefore, when the lock detecting signal LD is at a logic high level, second charge pump 68 becomes non-operative.

On the other hand, when the lock detecting signal LD is at a logic low, a logic high signal is transmitted to the NAND gate 69 through the invertor 72, and a logic low level lock detecting signal LD is transmitted to the NOR gate 70. At the same time, as shown in FIG. 16, when the phase of the reference signal LDR is advanced with respect to the comparison signal LDP, the logic low level phase difference signal $\phi$R, having a pulse width corresponding to the phase difference, is output from the phase comparator 27.

At the same time, the phase difference signal $\phi$P from the phase comparator 27 is at a logic high level. The NAND gate 69 outputs an output signal which is in-phase to phase difference signal $\phi$R, while the NOR gate 70 outputs a logic low level output signal, according to the phase difference signals φR and φP. As a result, transistor Tr4 becomes nonconductive in response to the logic low level output signal from NOR gate 70, while transistor Tr3 is intermittently conductive in response to the changes in the output signal from the NAND gate 69.

The ON/OFF switching operations of the transistor Tr3 is synchronized with the operation of the transistor Tr1 of the charge pump 28. That is, when the transistor Tr3 becomes conductive, the transistor Tr1 also becomes conductive. When the transistor Tr3 becomes non-conductive, the transistor Tr1 also becomes non-conductive. Therefore, when the phase of the reference signal LDR precedes the phase of the comparison signal LDP at a time when lock detecting signal LD is at a logic low level, second charge pump 68 together with the charge pump 28 are both in operation. In this case, output analog voltage signal "Do" from the charge pumps 28 and 68 consequently undergoes a rapid increase in amplitude, gets filtered through low pass filter LPF 30, and serves as a feedback control loop to VCO 26.

When the phase of the reference signal LDR is delayed with respect to that of comparison signal LDP as shown in FIG. 17, and when lock detecting signal LD is at a logic low, phase comparator 27 outputs a phase difference signal φP having the pulse width corresponding to the phase difference between LDR and LDP.

At the same time, the phase difference signal φR is at a logic high level. This logic high level phase difference signal φR is inverted by the invertor 71 and transmitted to the NAND gate 69. The signal in-phase to the phase difference signal φP is transmitted to the NOR gate 70 through the invertors 29 and 73. Therefore, the NAND gate 69 outputs a logic high level signal, while NOR gate 70 outputs intermittent logic high level signal. As a result, transistor Tr4 intermittently becomes conductive in response to the output signal from the NOR gate 70, while the transistor Tr3 becomes non-conductive in response to the output signal from the NAND gate 69.

The switching ON/OFF operation of the transistor Tr4 is in synchrony with the operation of transistor Tr2 of the charge pump 28. When transistor Tr4 becomes conductive, transistor Tr2 likewise becomes conductive. When transistor Tr4 becomes non-conductive, transistor Tr2 also becomes non-conductive. With a delay in the phase of reference signal LDR to comparison signal LDP at a time when lock detecting signal LD is at a logic low level, the second charge pump 68 together with charge pump 28 are both in operation. In this case, the output analog voltage signal "Do" from charge pumps 28 and 68 consequently undergoes a rapid decrease in amplitude, gets filtered through low pass filter LPF 30 and serves a feedback control loop to VCO 26.

The operation of the PLL frequency synthesizer circuit with the above-described configuration will now be described referring to FIGS. 16 through 18.

Figure 18:
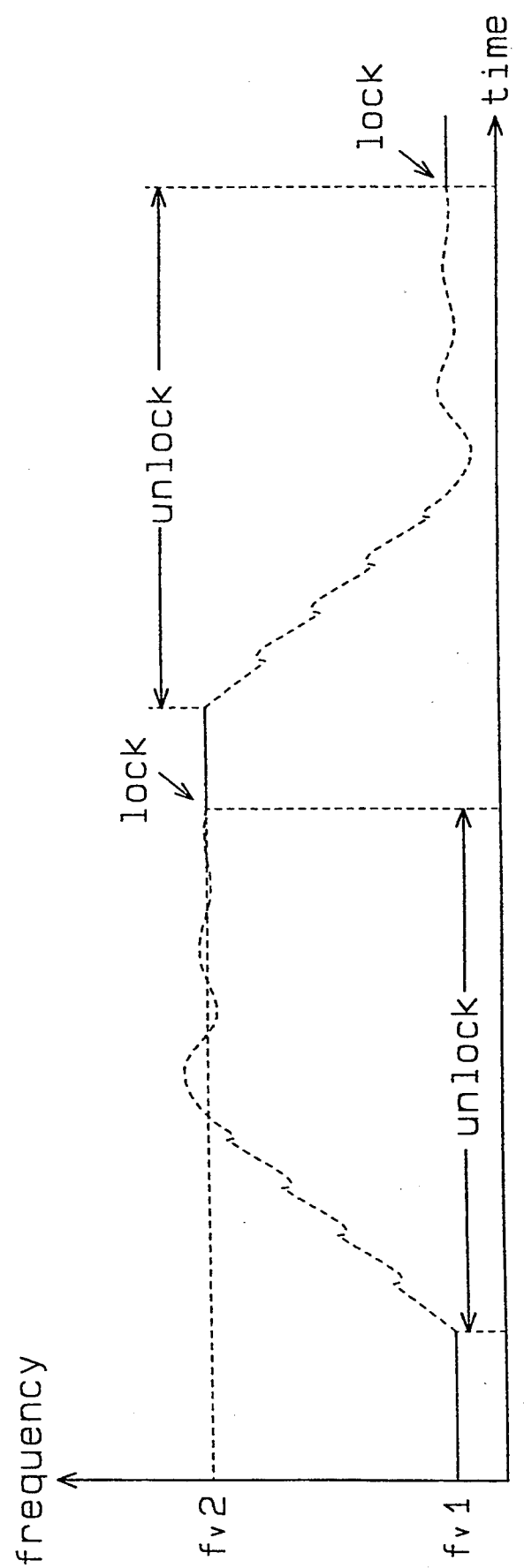
FIG. 18 is a waveform diagram showing the change in an output signal from the PLL frequency synthesizer when the preset frequency data is altered.

As shown in FIG. 18, the dividing ratio of the prescaler 24 will be altered such that the frequency of the output signal fv increases from that of preset frequency fv1 to that of frequency fv2. The alternation of the dividing ratio causes the frequency of the comparison signal LDP to be reduced with respect to reference signal LDR, as shown in FIG. 16. Pulse in comparison signal LDP begins to have a phase difference with respect to pulse in the reference signal LDR. The phase comparator 27 intermittently outputs the logic low level phase difference signal φR.

When the frequency of the comparison signal LDP is lower than that of the reference signal LDR, the frequency comparison signal LDR1 is output from the frequency comparison section 34 of the second frequency comparator 31B.

A logic low level first frequency difference signal XTCR is then output from the frequency difference detecting section 35. Consequently, the determination circuit 52 latches the L signal XTCR synchronously with second comparison signal DLDP1. The determination circuit 52 determines that the output signal fv is in the frequency unlock condition, and outputs logic low level lock detecting signal LD. At this stage, since the frequency of the comparison signal LDP is lower than that of the reference signal LDR, the second frequency difference signal XTCP rises to a logic high level.

This lock detecting signal LD is transmitted to the second charge pump 68. The second charge pump 68 is synchronously activated with the charge pump 28. The transistors Tr1, Tr3 of the charge pumps 28, 68 become conductive or non-conductive in response to the pulse of the phase difference signal φR. Therefore, the output voltage "Do", output to the LPF 30, undergoes a rapid increase in frequency.

In response to the rise of the output voltage "Do" (i.e., the rise of the controlled voltage signal VT), the frequency of the output signal "fv" approaches preset frequency "fv2" from the preset frequency "fv1". Eventually, signal "fv" overshoots the preset frequency fv2. Likewise, the frequency of the comparison signal LDP advances with respect to reference signal LDR, as does, the phase of the comparison signal LDP with respect to reference signal LDR. Therefore, the logic low level phase difference signal φP is output from the phase comparator 27 according to the phase difference between the comparison signal LDP and reference signal LDR.

When the frequency of the comparison signal LDP becomes higher than that of the reference signal LDR, the frequency comparison signal LDP1 is output from the frequency comparison section 32 of the second frequency comparator 31A. Then, the logic low level second frequency difference signal XTCP is output from the frequency difference detecting section 33.

Therefore, the determination circuit 52 in effect latches the logic low level second frequency difference signal XTCP synchronously with the second reference signal DLDR1. The determination circuit 52 determines that the output signal fv is in the frequency unlock condition, and outputs the logic low level lock detecting signal LD. This lock detecting signal LD is output to the second charge pump 68.

The second charge pump 68 continuously operates synchronously with the charge pump 28. The transistors Tr2, Tr4 of the charge pumps 28, 68 become conductive or non-conductive in response to the pulses in the phase difference signal φP. Therefore, the amplitude of output voltage "Do" output to the LPF 30 is lowered. Consequently, the frequency of the output signal "fv" of the VCO 26 is lowered so as to converge to the preset frequency fv2.

According to the above-described operation, output signal "fv" from the VCO 26 is repeatedly over or undershoots preset frequency "fv2". Logic low level lock detecting signal LD is output until the output signal "fv" converges to the preset frequency "fv2". However, when the output signal "fv" approaches the preset frequency "fv2", the first and second frequency difference signals XTCR, XTCP rise to a high logic causing determination circuit 52 to determine whether the frequency is still unlocked.

Therefore, as shown in FIG. 16, the determination whether or not the output signal "fv" converges to the preset frequency "fv2" can be accurately preformed due to a direct comparison of their frequencies. This is even the case when the phase difference if "fv" and "fv2" become nominal during the repeated overshooting and undershooting of "fv" with respect to "fv2".

Similarly, as shown in FIG. 18, when the frequency of the output signal "fv" is altered from the preset frequency "fv2" to the preset frequency "fv1", the determination whether or not the output signal "fv" converges to the preset frequency "fv1" can be accurately determined.

According to this embodiment, the first and second frequency comparators 31A and 31B compare the frequency of the reference signal LDR with that of the comparison signal LDP. The first comparator 31A detects whether the frequency of the comparison signal LDP is higher than the frequency of the reference signal LDR. The second comparator 31B detects whether the frequency of the comparison signal LDP is lower than the frequency of the reference signal LDR.

When the determination circuit 52 determines that the frequency of the comparison signal LDP differs from the frequency of the reference signal LDR, the determination circuit 52 outputs a logic low level lock detecting signal LD as an unlock signal.

When the determination circuit 52 determines that the frequency of the comparison signal LDP is equal to the frequency of the reference signal LDR, determination circuit 52 outputs a logic high level lock detecting signal LD as a lock signal. Therefore, as the frequency of the comparison signal LDR and the phase of the reference signal LDR are directly compared with each other to detect the frequency lock or unlock condition, the lock detection can be accurately detected, unlike the conventional method in which the phase of the comparison signal LDP is compared with that of the reference signal LDR to detect the frequency lock or unlock condition.

As the second charge pump 68 is adapted to be operated in the frequency unlock condition according to the lock signal LD, the voltage signal "Do" can be rapidly shifted to a voltage corresponding to the lock condition. As a result, the period of time for locking up the frequency can be shortened. The high speed tuning operation of the movable communication device including this PLL frequency synthesizer can be realized.

Although only one embodiment of the present invention has been described herein, it should be apparent to those skilled in the art that the present invention may be embodied in many other specific forms without departing from the spirit or scope of the invention.

For example, in this embodiment according to the present invention, the second charge pump 68 is operated when the lock detecting signal LD is at a logic low level, in response to the operations of the NAND gate 69 and NOR gate 70. A gate circuit such as a transfer gate can be employed instead of the above circuit. The phase difference signals φR, φP, in this case, are transmitted to the bases of the transistors Tr3, Tr4 only when the lock detecting signal LD is at the logic low level. Further, an analog switch 9 can be connected to the LPF 30 in parallel, as shown in FIG. 4.

The switch 9 may be designed to close the circuit when the lock detecting signal LD is at a logic low level, or open the circuit when the signal LD is at a logic high level. As configured as the above-described manner, the output voltage "Do" from the charge pump 28 as the controlled voltage signal VT is directly coupled to the VCO 26 during the frequency unlock condition. Therefore, as the frequency of the output signal "fv" from the VCO 26 can be rapidly shifted to a new preset frequency, the period of time for locking the frequency can be shortened.

Furthermore, the switch 9 and second charge pump 68 can be employed together. The period of time for locking the frequency, in this case, can be further shortened. Although the lock detecting signal LD is utilized as a control signal to control the second charge pump 68 and switch 9, the signal LD can be utilized as a control signal for controlling an indicator which permits the visual observation of the frequency locked or unlocked condition.

What is claimed is:

1. A phase locked loop frequency synthesizer circuit for detecting and generating a signal locked to a predetermined frequency, the phase locked loop frequency synthesizer circuit comprising:

a voltage controlled oscillator providing an oscillating signal;

a clock providing a clocked signal;

reference frequency dividing means, coupled to the clock, for dividing the clocked signal into a reference frequency signal having a first frequency and a first phase;

comparison frequency divider means, coupled to the voltage controlled oscillator, for receiving the oscillating signal and dividing said oscillating signal into a comparison signal having a second frequency and a second phase, said comparison frequency divider means comprising;

prescaler circuit means, coupled to the voltage controlled oscillator, for dividing the oscillating signal into a divided signal having a third frequency, and a comparison frequency divider, coupled to the prescaler circuit means, receiving the divided signal, dividing the divided signal, and transmitting the comparison signal;

a phase comparator, coupled to the reference frequency dividing means and to the comparison frequency divider means, detecting a phase difference between the first phase of the reference frequency signal and the second phase of the comparison signal and transmitting a phase difference signal in response to the phase difference;

a first charge pump, coupled to the phase comparator, transmitting a first voltage signal in response to the phase difference signal from the phase comparator;

a low pass filter, coupled to the first charge pump and to the voltage controlled oscillator, smoothing out the first voltage signal from the first charge pump to remove high frequency components therefrom, the low pass filter generating a controlled voltage signal and transmitting the controlled voltage signal to the voltage controlled oscillator; and a frequency lock determining circuit, coupled to the reference frequency dividing means and to the comparison frequency divider means, comparing the first frequency of the reference frequency signal with the second frequency of the comparison signal and generating a frequency difference, said frequency lock determining circuit transmitting a lock detecting signal if the frequency difference between the first frequency and the second frequency is within a preset value range, and transmitting an unlock detecting signal if the frequency difference between the first frequency and the second frequency exceeds the preset value range, said frequency lock determining circuit comprising;

a first frequency comparator, coupled to the reference frequency dividing means and to the comparison frequency divider means, receiving the reference frequency signal and the divided signal, and transmitting a first detection signal if the third frequency of the divided signal is higher than the first frequency of the reference frequency signal, a second frequency comparator, coupled to the comparison frequency divider means and to the clock, receiving the clocked signal and the comparison signal and for transmitting a second detection signal if a frequency of the clocked signal is higher than the second frequency of the comparison signal, and a frequency determination circuit, coupled to the first frequency comparator and to the second frequency comparator, transmitting the unlock detecting signal when at least one of the first and second detection signals is transmitted from the first and second frequency comparators.

2. A phase locked loop frequency synthesizer circuit according to claim 1, further comprising a second charge pump communicatively connected to the first charge pump and to the frequency lock determining circuit, said second charge pump being deactivated in response to receiving the lock detecting signal, and being activated to output a second voltage signal to the first charge pump if said second charge pump receives the unlock detecting signal.

3. A phase locked loop frequency synthesizer circuit according to claim 1, further comprising an analog switch connected in parallel with the low pass filter and receiving the lock detecting signal, said analog switch being opened in response to receiving the lock detecting signal and being closed in response to receiving the unlock detecting signal.

4. A phase locked loop frequency synthesizer circuit according to claim 1, further comprising:

a second charge pump, coupled to the first charge pump and to the frequency lock determining circuit, said second charge pump being deactivated in response to receiving the lock detecting signal, and being activated to output a second voltage signal to the first charge pump if said second charge pump receives the unlock detecting signal; and an analog switch connected in parallel with the low pass filter and receiving the lock detecting signal, the analog switch being opened in response to receiving the lock detecting signal and being closed in response to receiving the unlock detecting signal.

5. A phase locked loop frequency synthesizer circuit according to claim 1, wherein the first frequency comparator comprises:

a first frequency comparison section, coupled to the reference frequency divider means and to the prescaler circuit means, comparing the reference frequency signal and the divided signal from the prescaler circuit means, determining whether a predetermined number of pulses of the divided signal are counted before receiving a subsequent pulse from the reference frequency signal, detecting whether a frequency difference between the divided signal and the reference frequency signal exists, said frequency difference being determined according to a time-based difference between a pulse of the reference frequency signal and a pulse of the divided signal from the prescaler circuit means, and transmitting a first comparison section output signal having a first comparison section output frequency;

a first frequency difference detecting section, coupled to the reference frequency divider means and the frequency comparison section, detecting a first frequency difference between a fourth frequency of a first reference signal derived from the reference frequency signal and the first comparison section output signal frequency, wherein said first frequency difference is converted into a first frequency difference signal; and a second frequency comparison section, coupled to the clock and to the comparison frequency divider, receiving the clocked signal and the comparison signal from the comparison frequency divider, determining whether a predetermined number of pulses of the clocked signal are counted before receiving a subsequent pulse of comparison signal, detecting whether a frequency difference between the clocked signal and the comparison signal exists, said frequency difference being determined based on the difference between the pulse of the second comparison signal and the pulse of the clock signal, and transmitting a second comparison section output signal having a second comparison section output frequency; and a second frequency difference detecting section, coupled to the second frequency comparison section and to the comparison frequency divider means, detecting a second frequency difference between a frequency of a second reference signal derived from the comparison signal and the second comparison section output frequency from the second frequency comparison section, wherein said second frequency difference is converted into a second frequency difference signal.

6. A phase lock loop frequency synthesizer circuit for detecting and generating a signal locked to a predetermined frequency, the phase lock loop frequency synthesizer circuit comprising:

a voltage controlled oscillator providing an oscillating signal;

a clock providing a clocked signal;

a reference frequency divider coupled to the clock and dividing the clocked signal into a reference frequency signal;

prescaler circuit means, coupled to the voltage controlled oscillator, for dividing the oscillating signal and outputting a divided signal;

a comparison frequency divider, coupled to the prescaler circuit means, receiving the divided signal and dividing the divided signal into a comparison signal;

a phase comparator, coupled to the reference frequency divider and to the comparison frequency divider, detecting a phase difference between the reference frequency signal and the comparison signal and transmitting a phase difference signal in response go the phase difference;

a first charge pump, coupled to the phase comparator, transmitting a first voltage signal in response to the phase difference signal from the phase comparator:

a low pass filter, coupled to the first charge pump and to the voltage controlled oscillator, smoothing out the first voltage signal from the first charge pump to remove high frequency components therefrom, said low pass filter generating a controlled feedback voltage signal for input into said voltage controlled oscillator;

a first frequency comparator, coupled to the prescaler circuit means and to the comparison frequency divider, receiving the divided signal from the prescaler circuit means and the reference frequency signal and transmitting a first detection signal when a frequency of the divided signal is higher than a frequency of the reference signal;

a second frequency comparator receiving the clocked signal and the comparison signal and transmitting a second detection signal when a frequency of the reference frequency signal is higher than the frequency of the comparison signal;

a determination circuit, coupled to the first frequency comparator and to the second frequency comparator, transmitting an unlock detecting signal and a lock detecting signal;

a second charge pump coupled to the first charge pump and to the determination circuit, said second charge pump being deactivated upon receiving said lock detecting signal and being activated to generate a second voltage signal in cooperation with the first charge pump upon receiving the unlock detecting signal; and an analog switch connected in parallel with the low pass filter and receiving the lock detecting signal, the analog switch being opened in response to receiving the lock detecting signal and being closed in response to receiving the unlock detecting signal.

* * * * *

UNITED STATES PATENT AND TRADEMARK OFFICE
CERTIFICATE OF CORRECTION

PATENT NO. : 5,410,571

DATED : April 25, 1995

INVENTOR(S) : Masayuki YONEKAWA, et al.

It is certified that error appears in the above-indentified patent and that said Letters Patent is hereby corrected as shown below:

Title Page [73] Assignee, "VSLI" should be --VLSI--;

Col. 6, line 38, "nonconductive" should be --non-conductive--;

Col. 12, line 2, "will be" should be --is--;

Col. 12, line 44, "an" should be --a--;

Col. 13, line 3, "nonconductive" should be --non-conductive--.

Signed and Sealed this

Sixteenth Day of April, 1996

BRUCE LEHMAN

*Attest:*

*Attesting Officer*  *Commissioner of Patents and Trademarks*